US00RE35613E

United States Patent [19]

Yasuda et al.

[11] E Patent Number: Re. 35,613

[45] Reissued Date of Patent: Sep. 23, 1997

[54] DYNAMIC RANDOM ACCESS MEMORY WITH ISOLATED WELL STRUCTURE

[75] Inventors: Kenichi Yasuda; Makoto Suwa; Shigeru Mori, all of Itami, Japan

[73] Assignee: Mitsubishi Denki Kabushiki Kaisha, Tokyo, Japan

[21] Appl. No.: 496,569

[22] Filed: Jun. 29, 1995

Related U.S. Patent Documents

Reissue of:

[64] Patent No.: 5,281,842
Issued: Jan. 25, 1994
Appl. No.: 722,164
Filed: Jun. 27, 1991

[30] Foreign Application Priority Data

Jun. 28, 1990 [JP] Japan ..... 2-172407
Oct. 22, 1990 [JP] Japan ..... 2-284959

[51] Int. Cl.[6] ..... H01L 27/02

[52] U.S. Cl. ..... 257/371; 257/296; 257/369; 365/182

[58] Field of Search ..... 257/296, 297, 257/358, 369, 371, 659; 365/181, 182, 226

[56] References Cited

U.S. PATENT DOCUMENTS 4,163,245 7/1979 Kinoshita ..... 357/51
5,079,613 1/1992 Sawada et al. ..... 357/42
5,404,042 4/1995 Okumura et al. ..... 257/296

FOREIGN PATENT DOCUMENTS 0298421 1/1989 European Pat. Off. .
4114359 11/1991 Germany .

OTHER PUBLICATIONS

Fujii et al., "A 45–ns 16–Mbit DRAM With Triple–Well Structure", IEEE Journal of Solid–State Circuits, vol. 24, No. 5, Oct. 1989, pp. 1170–1175.
1989 ISSCC Digest of Technical Papers, IEEE International Solid–State Circuit Conference, Feb. 1989, pp. 248–249.

*Primary Examiner*—Minh-Loan Tran
*Attorney, Agent, or Firm*—Leydig, Voit & Mayer

[57] ABSTRACT

A semiconductor memory device includes a first conductivity type well in a first conductivity type semiconductor substrate surrounded by a second conductivity type well, one of a memory cell and an external input circuit arranged on the first conductivity type well and the other disposed outside the second conductivity type well. A predetermined power supply voltage is applied to the second conductivity type well and the first conductivity type well is connected to ground. In the structure, charge carriers injected from the external input circuit are absorbed in the second conductivity type well. As a result, the charge carriers are prevented from reaching the memory cell and destroying data stored therein. Therefore, it is possible to miniaturize transistors and increase integration density of dynamic random access memory devices without degrading the source to drain dielectric strength.

16 Claims, 14 Drawing Sheets

DYNAMIC RANDOM ACCESS MEMORY WITH ISOLATED WELL STRUCTURE

Matter enclosed in heavy brackets [ ] appears in the original patent but forms no part of this reissue specification; matter printed in italics indicates the additions made by reissue.

BACKGROUND OF THE INVENTION

1. Field of the Invention

The invention relates generally to semiconductor memory devices and, more particularly, relates to semiconductor memory devices in which increased integration density is achieved by preventing destruction of data stored in memory cells due to injection of electrons.

2. Description of the Background Art

One example of a conventional semiconductor memory device will be described in the following, referring to FIG. 1. FIG. 1 shows a structure of a DRAM (Dynamic Random Access Memory) including a CMOS (Complementary Metal Oxide Semiconductor), employing an n-channel MOS field-effect transistor and a p-channel MOS field-effect transistor (refer to "IEEE Journal of Solid-State Circuit Vol. 24, No. 5, October 1989, p1170–p1174"). The DRAM has an n-well 2 and p-well 3 formed on a p-type semiconductor substrate 1. The n-well 2 is connected to a power supply voltage $V_{CC}$ that is applied to an n-type impurity region 4 therein and the p-well 3 is connected to a substrate voltage $V_{BB}$ that is applied to a p-type impurity region 5 therein. A p-channel MOS field-effect transistor (hereinafter referred to as "pMOSFET") 6 is formed on the surface of the n-well 2 and two n-channel MOS field-effect transistors (hereinafter referred to as "nMOSFET") 7a, 7b are formed on the surface of the p-well 3.

The pMOSFET 6 includes p-type impurity diffusion regions 8 as source and drain regions and a gate electrode 10 formed over a channel region between the p-type impurity diffusion regions 8 with a gate oxide film 9 interposed therebetween. The nMOSFETs 7a, 7b include n-type impurity diffusion regions 11a, 11b as source and drain regions and gate electrodes 13a and 13b over channel regions between the n-type impurity diffusion regions 11a and 11b and respectively with gate oxide films 12a, 12b interposed therebetween. In the general CMOS circuit structured in such a way, the source electrode S1 of the pMOSFET 6 is connected to the power supply voltage level $V_{CC}$ terminal and the source electrode $S_2$ of the nMOSFET is connected to the ground terminal at the potential of ground level $V_{SS}$. The nMOSFET 7b is one memory cell among a multiplicity of memory cells and has the gate electrode 13b to be a word line (WL) and the two n-type impurity diffusion regions 11b connected to a storage node (SN) which is a charge-storage electrode and a bit line (BL) which is a read/write electrode respectively. Another cross section of the memory cell is shown in FIG. 3A and an equivalent circuit thereof is shown in FIG. 3B. A thick oxide film 14 selectively formed on the semiconductor substrate 1 provides insulation between diffusion regions.

The operation of the semiconductor memory device structured as stated above will now be described. Generally, a negative potential of the order of −3 V is, for example, supplied as a substrate potential $V_{BB}$. The reason for it is as follows. When an externally applied input signal is supplied to the n-type impurity diffusion regions 11a formed in the p-well 3, the potential $V_{BB}$ of the p-well 3 sometimes becomes higher than the potential of the n-type impurity, diffusion region 11a because of the undershoot when the signal changes, for example, from an H level to an L level and because of the negative potential being supplied as the input of the L level, where undershoot occurs in which the voltage attains a negative level for a undershoot is indicated by an arrow A in FIG. 2 where an external signal is supplied to a terminal and changes, for example, from 5 V to 0 V as shown in the figure. Therefore, when $V_{BB}$ is 0 V, the pn junction of the n-type impurity diffusion regions 11a and the p-well 3 becomes forward biased, so that electrons are injected. The electrons are injected in the direction from the n-type impurity diffusion regions 11a to the p-well, so that the injected electrons reach the memory cell and destroy the data in the memory cell. The negative potential $V_{BB}$, is supplied in order to prevent such an injection of electrons.

As miniaturization of the gate electrodes 10, 13a, and 13b is advanced in devices with a larger storage capacity, however, there occurs problem that the dielectric strength between the source and drain or the transistor is reduced by the negative potential, i.e., the substrate potential. That is, application of a negative voltage to the p-well 3 increases the threshold voltages of the nMOSFETs 7a, 7b. When the concentration of the p-type impurities of the channel is decreased in order to control the increase in the threshold voltages, the depletion layer tends to be expanded in the channel and punch through occurs between the source and drain, so that the dielectric strength between the source and drain is decreased. Therefore, there is a problem that it is difficult to miniaturize the transistor as far as the negative potential is supplied to the substrate potential.

SUMMARY OF THE INVENTION

An object of the invention is to provide a semiconductor memory device with increased integration density and storage capacity by preventing, without degrading the dielectric strength between source and drain, a phenomenon in which data stored in a memory cell is destroyed by injection of charge carriers.

A semiconductor device in according with the present invention for achieving the object includes a first well of a first conductivity type formed in a semiconductor substrate of a first conductivity type, a second conductivity type well formed in the semiconductor substrate adjacent to the first well of the first conductivity type, a second well of the first conductivity type formed within the second conductivity type well and a memory cell formed on the second well of the first conductivity type, A power supply voltage level of a predetermined polarity is supplied to the second conductivity type well and a prescribed potential of polarity reverse to the power supply voltage or the ground potential is supplied independently to each of the first well of the first conductivity type and the second well of the first conductivity type.

In accordance with the semiconductor memory device, the second conductivity type well surrounds the second well of the first conductivity type where a memory cell is formed, the power supply voltage level of the predetermined polarity is supplied to the second conductivity type well and the prescribed voltage of polarity reverse to the power supply voltage or the ground level is supplied independently to each of the first well of the first conductivity type and the second well of the first conductivity type, so that a reverse bias voltage is applied to a pn junction formed by the first conductivity type well and the second conductivity type well. Therefore, the second conductivity type well absorbs carriers injected into each of the first conductivity type wells or the semiconductor substrate and, also, insulation in the pn junction prevents the carriers from reaching the memory cell. As a result, destruction of the data stored in the memory cell is prevented.

In another aspect, a semiconductor memory device in accordance with the present invention includes a second conductivity type well and a first conductivity type well formed inside it in a semiconductor substrate of the first conductivity type, an external input circuit is provided in the well region of the first conductivity type and a memory cell is arranged outdo the well region of the second conductivity type.

In accordance with the structure, the carriers injected in the first conductivity type well from the external input circuit are absorbed in the second conductivity type well and are prevented from reaching the memory cell.

In still another aspect, the semiconductor memory device in accordance with the present invention has first and second wells of the first conductivity type and a second conductivity type well formed from the surface of a first conductivity type semiconductor substrate to a predetermined depth, the second well of the first conductivity type being surrounded by the second conductivity type well and formed by high energy ion implantation.

In accordance with such a structure, it is also possible to electrically insulate the second well of the first conductivity type from the first well of the first conductivity type and the semiconductor substrate. Therefore, when either of a memory cell and an external input circuit is formed in a region of the second well of the first conductivity type and is electrically isolated, destruction of the data stored in the memory cell due to injection of carriers is prevented. Furthermore, a smaller amount of ion implantation is required for forming the second well of the first conductivity type compared to the case where impurities of the first conductivity type are implanted in a region of the second conductivity type well to form a well having a double structure. Accordingly, it is possible to control the decrease in mobility of carriers due to impurities in the second well of charge the first conductivity type.

The foregoing and other objects features, aspects and advantages of the present invention will become more apparent from the following detailed description of the present invention when taken in conjunction with the accompanying drawings.

DESCRIPTION OF THE PREFERRED EMBODIMENTS

Figure 4:
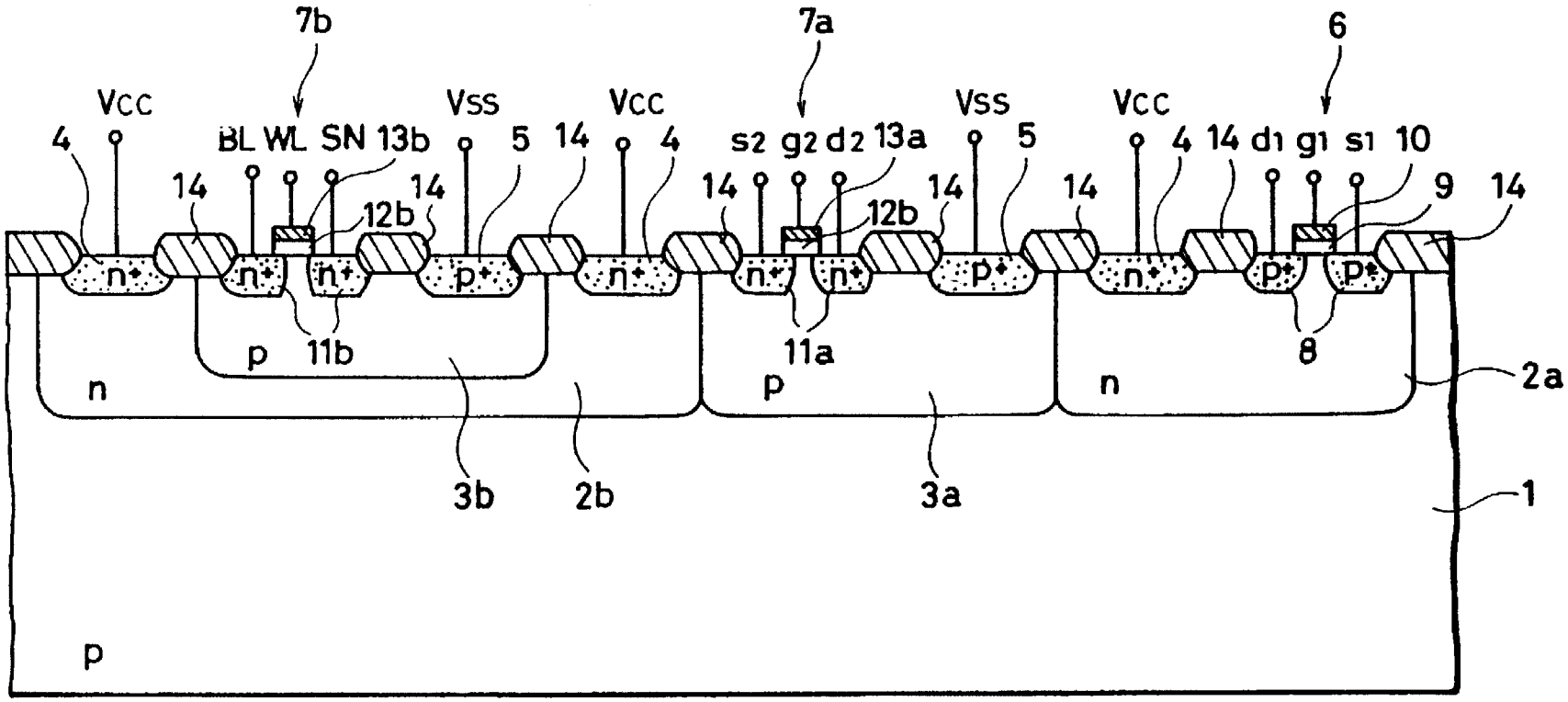
FIG. 4 is a cross sectional view showing a structure of a DRAM in accordance with a first embodiment of the present invention.
Figure 5:
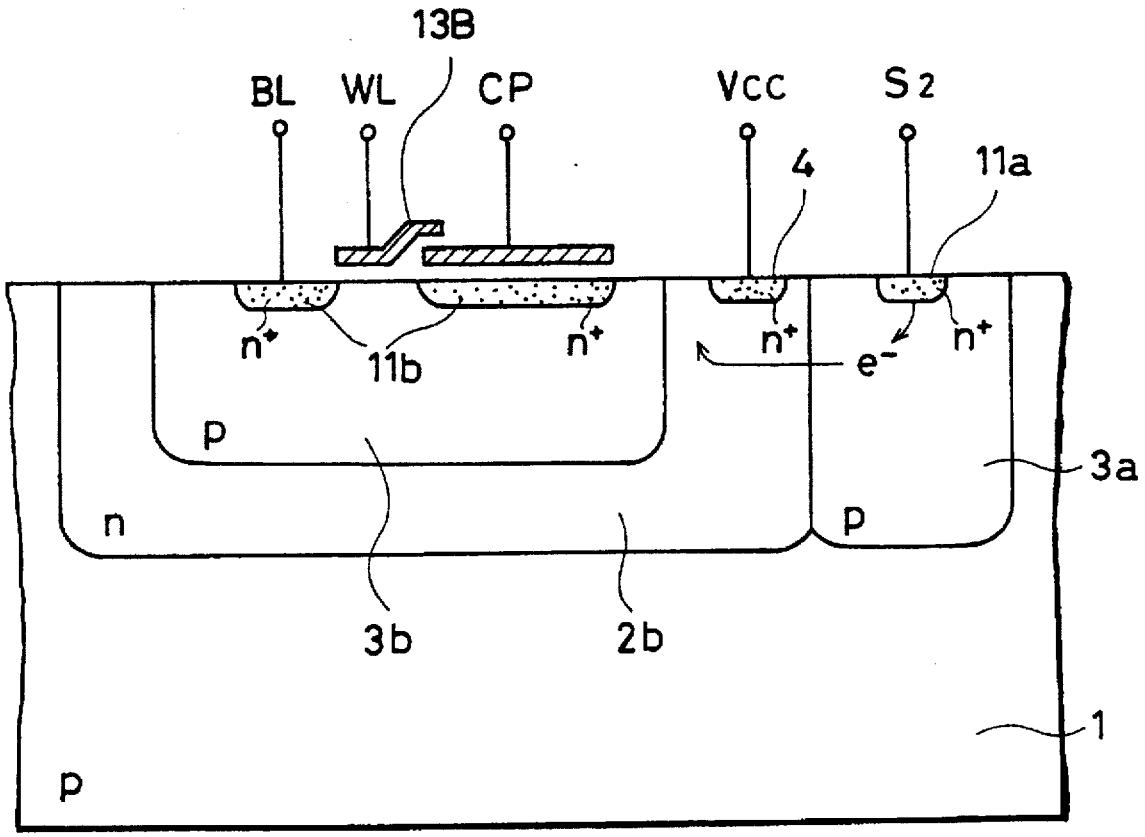
FIG. 5 is an expanded cross sectional view showing another cross section in the vicinity of the memory cell in the DRAM shown in FIG. 4.

A fast embodiment in accordance with the present invention will now be described referring to FIGS. 4 and 5. FIG. 4 shows an embodiment in which the present invention is applied to a DRAM including a CMOS. Referring to PIG. 4, the semiconductor memory device in accordance with this embodiment has a first n-well 2a, a first p-well 3a, a second p-well 3b and a second n-well 2b surrounding the second p-well 3b on a p-type semiconductor substrate 1 of a first conductivity type 1. A positive power supply voltage $V_{CC}$ is applied to the first n-well 2a and the second n-well 2b through n-type impurity diffusion regions 4.

An nMOSFET 7a is formed on the first p-well 3a and a pMOSFET 6 is formed on the first n-well 2a. The nMOSFET 7a and the pMOSFET 6 comprise a CMOS as a peripheral circuit of the DRAM in the embodiment. The pMOSFET 6 mainly includes p-type impurity diffusion regions 8 as source and drain regions and a gate electrode 10 formed above the channel region between the source and drain over a gate insulating film. The nMOSFET 7a includes n-type impurity diffusion regions 11a as source and drain regions and a gate electrode 13a formed above the channel region between the source and drain regions over a gate insulating film 12a, An nMOSFET 7b is formed on the second p-well 3b surrounded by the second n-well 2b, comprising a memory cell of the DRAM. The nMOSFET 7b mainly includes n-type impurity diffusion regions 11b as source and drain regions and a gate electrode 13b above the channel region between the source and drain regions over a gate insulating film 12b.

A positive power supply voltage $V_{CC}$ is applied to the first n-well 2a and the second n-well 2b through the impurity diffusion region 4. The ground potential $V_{SS}$ is applied to the first p-well 3a and the second p-well 3b through the p-type impurity diffusion region 5. These diffusion regions are isolated and insulated from each other by an oxide film According to this embodiment with the above-mentioned structure, a reverse bias has been already applied to the pn junction formed at the boundary between the second p-well 3b, which is at the ground potential $V_{SS}$, and the second n-well 2b, which is at the power supply voltage $V_{CC}$. Therefore, for example, when the potential of the n-type impurity diffusion region 11b in the second p-well 3b is provided with a negative potential as an undershoot at the time of change of the input signal from H to L or as an L level of the input, it attains a negative potential lower than the ground potential $V_{SS}$. As a result, even if an injection of electrons from the n-type impurity diffusion regions 11b to the p-well 3b is caused, the injected electrons are absorbed by the second n-well 2b at the $V_{CC}$ potential as shown in FIG. 5. The provided by the pn junction also prevents the electrons from reaching the memory cell, so that it is possible to prevent the data stored in the memory cell from being destroyed.

Since the potentials of the first p-well 3a and the second p-well 3b are fixed at the ground potential $V_{SS}$, the threshold voltage of the nMOSFET 7b is not increased as in the case in which a negative potential is applied, so that it is unnecessary to reduce the p-type impurity concentration in the channel region. As a result, it is possible to achieve miniaturization, maintaining the source and drain dielectric strength of the nMOSFETs 7a and 7b.

In the embodiment above, the description was made of a case in which a memory cell is formed including the nMOSFET 7b on the second p-well 3b surrounded by the n-type well 2b. If the conductivity types of the wells are all reversed, only the polarity of $V_{CC}$ is reversed and the carriers injected are changed from electrons to holes, the same effects result.

A second embodiment in accordance with the present invention will now be described with reference to FIGS. 6 to 13. In FIGS. 6 to 13, elements the same as or corresponding to those shown in FIG. 4 are given the same reference numerals and a detailed description thereof will not be repeated here.

While the destruction of data stored in the memory cell due to the injection of the electrons from the outside of the second n-well 2b is prevented by providing the nMOSFET 7b, comprising the memory cell, within of the second p-well 3b formed inside the second n-well 2b in the first embodiment above, the data stored in the memory cell (nMOSFET 7b) in the region outside the second n-well 2b is prevented from being destroyed due to the injection of the electrons from an external input circuit by providing an nMOSFET comprising an the external input circuit in a region within the second p-well 3b that is formed within the second n-well 2b.

Figure 1:
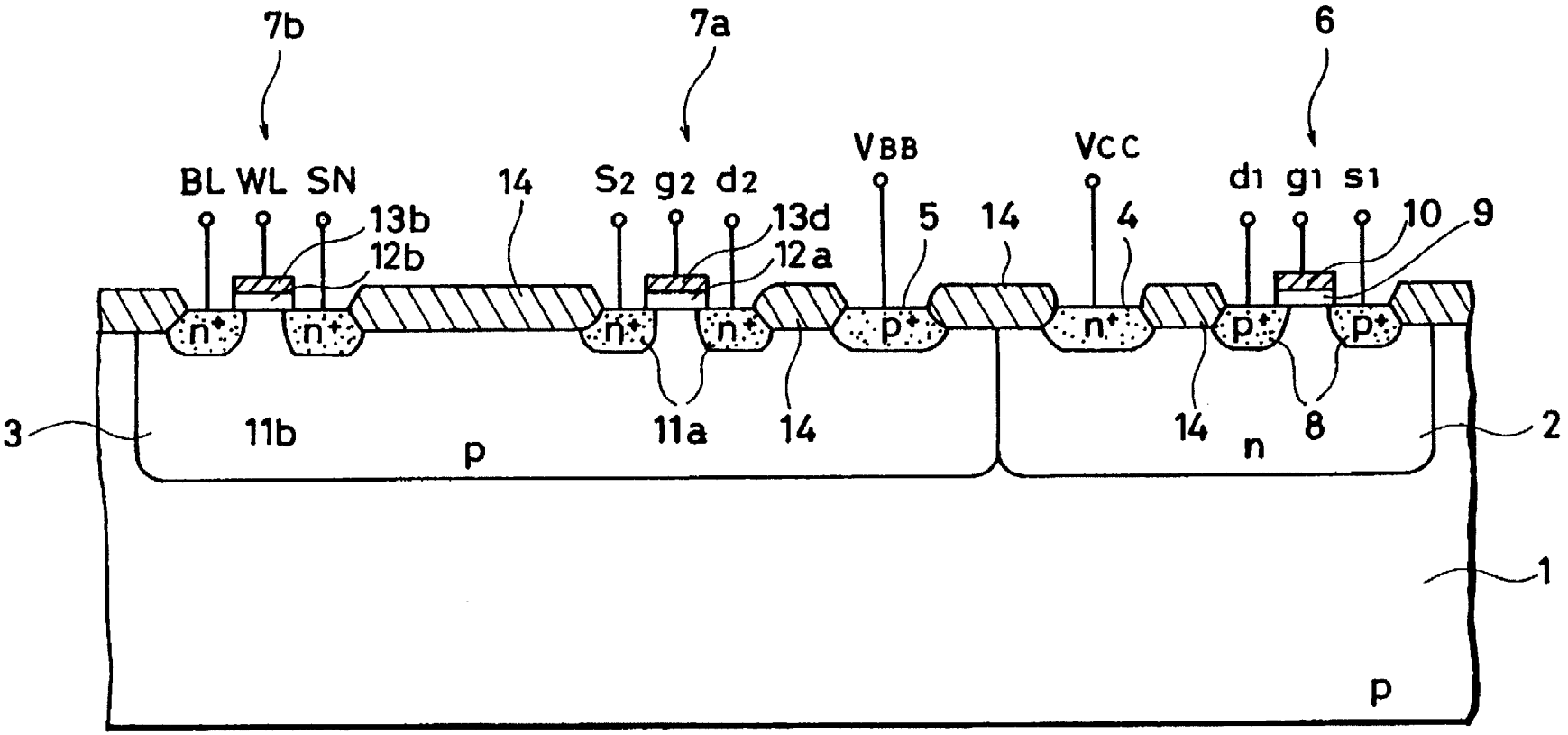
FIG. 1 PRIOR ART
FIG. 1 is a cross sectional view showing structure of a conventional DRAM.
Figure 2:
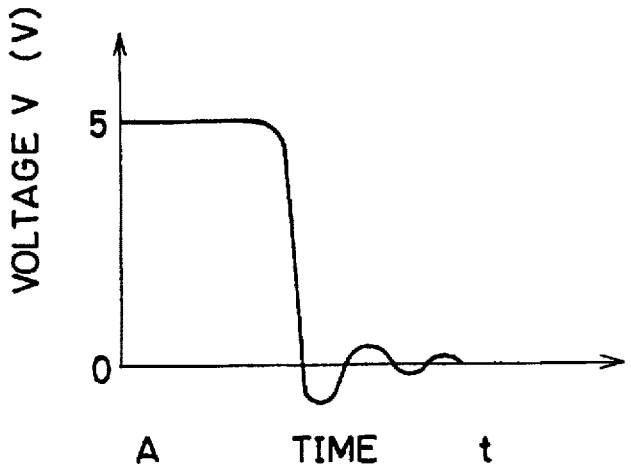
FIG. 2 PRIOR ART
FIG. 2 is a diagram for explaining a phenomenon of an undershoot.
Figure 3A:
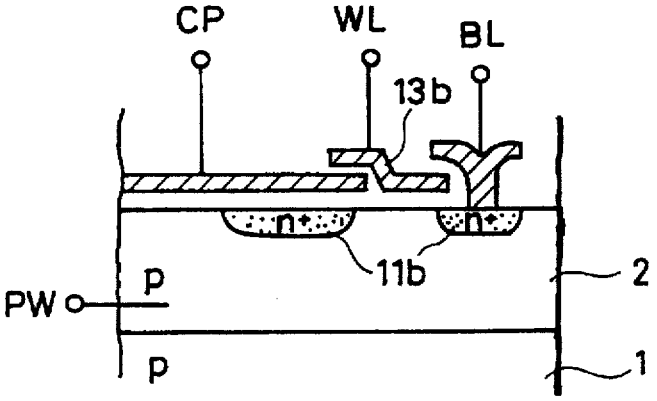
FIG. 3A PRIOR ART
FIG. 3A is a diagram showing another cross section in the vicinity of a memory cell in the conventional DRAM shown in FIG. 1.
Figure 3B:
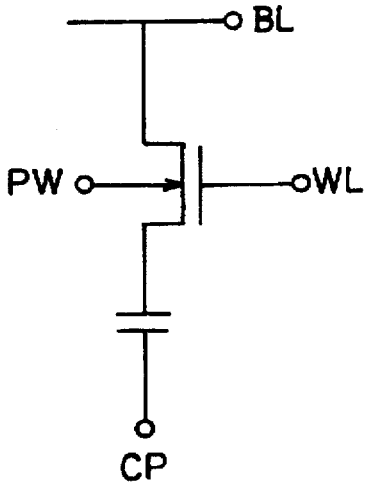
FIG. 3B PRIOR ART
FIG. 3B is an equivalent circuit diagram of the memory cell shown in FIG. 3A.
Figure 6:
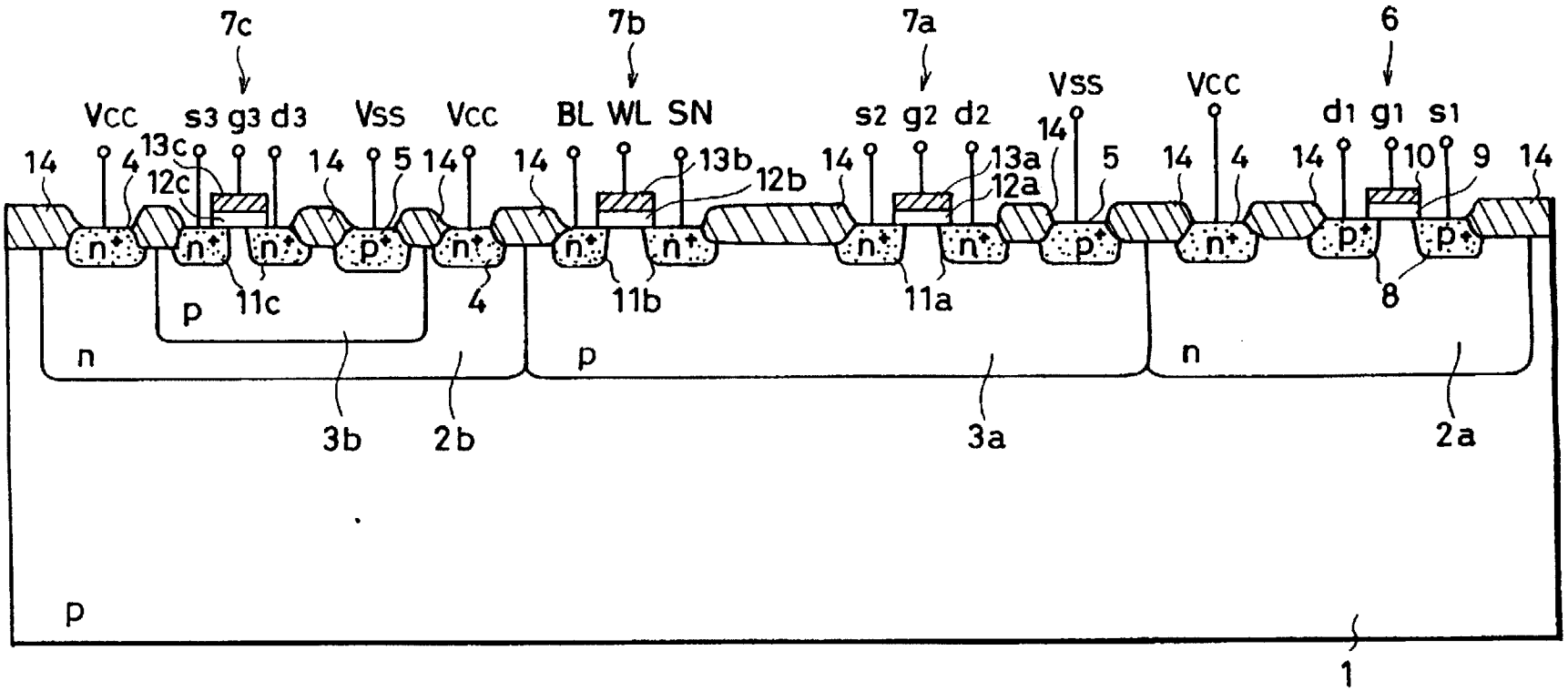
FIGS. 6, 7, 8, 9, 10, 11, 12 and 13 are cross sectional views showing structures in accordance with a second embodiment of the present invention.

In a structure shown in FIG. 6 according to the second embodiment, an effect on the memory cell is averted by isolating only an nMOSFET 7c in advance as an external input circuit in which an injection of electrons tends to occur, while maintaining the arrangement of the pMOSFET 6 and the nMOSFETs 7a and 7b the same as that in the conventional embodiment shown in FIG. 1.

Referring to FIG; 6, the nMOSFET 7c includes n-type impurity diffusion regions 11c as source and drain regions and a gate electrode 13c above a channel region between the n-type impurity diffusion regions 11c with a gate oxide film 12c interposed therebetween. Though the external input circuit actually includes a plurality of nMOSFETs, only one nMOSFET 7c is representatively shown in FIG. 6 to simplify the description. The source terminal $s_3$ among the source terminal $s_3$, the drain terminal $d_3$ and the gate terminal $g_3$ of the nMOSFET 7c, is electrically connected to an external input terminal (not shown).

The operation in the structure shown in FIG. 6 according to the embodiment will now be described. The second p-well 3b where the nMOSFET 7c is provided is fixed at the ground potential $V_{SS}$. When the potential of the n-type impurity diffusion region 11c in the second p-well 3b is provided with a negative potential as an undershoot at the time of the input signal bring changed from H to L or as an L level of the input signal, the potential of region 11c is decreased below the ground potential $V_{SS}$. Even if electrons are injected from the n-type impurity diffusion regions 11c to the second p-well 3b, the second n-well 2b surrounding the second p-well 3b is fixed at the power supply potential $V_{CC}$, so that the injected electrons are absorbed in the second n-well 2b. Therefore, the injected electrons do not reach the nMOSFET 7b comprising the memory cell and the data stored therein is not destroyed.

Furthermore, as the first p-well 3a and the second p-well 3b are fixed at the ground potential $V_{SS}$, there occurs no such problem as occurs in the conventional embodiment when the negative potential is applied. Therefore, it is possible to achieve miniaturization, increasing integration density, while maintaining the source and drain dielectric strength of the nMOSFETs 7a, 7b, and 7c.

In this embodiment, when the conductivities of the elements are all reversed, the polarity of $V_{CC}$ is reversed and the carriers injected are only changed from electrons to holes, resulting in the same effects as in the first embodiment above.

Figure 7:
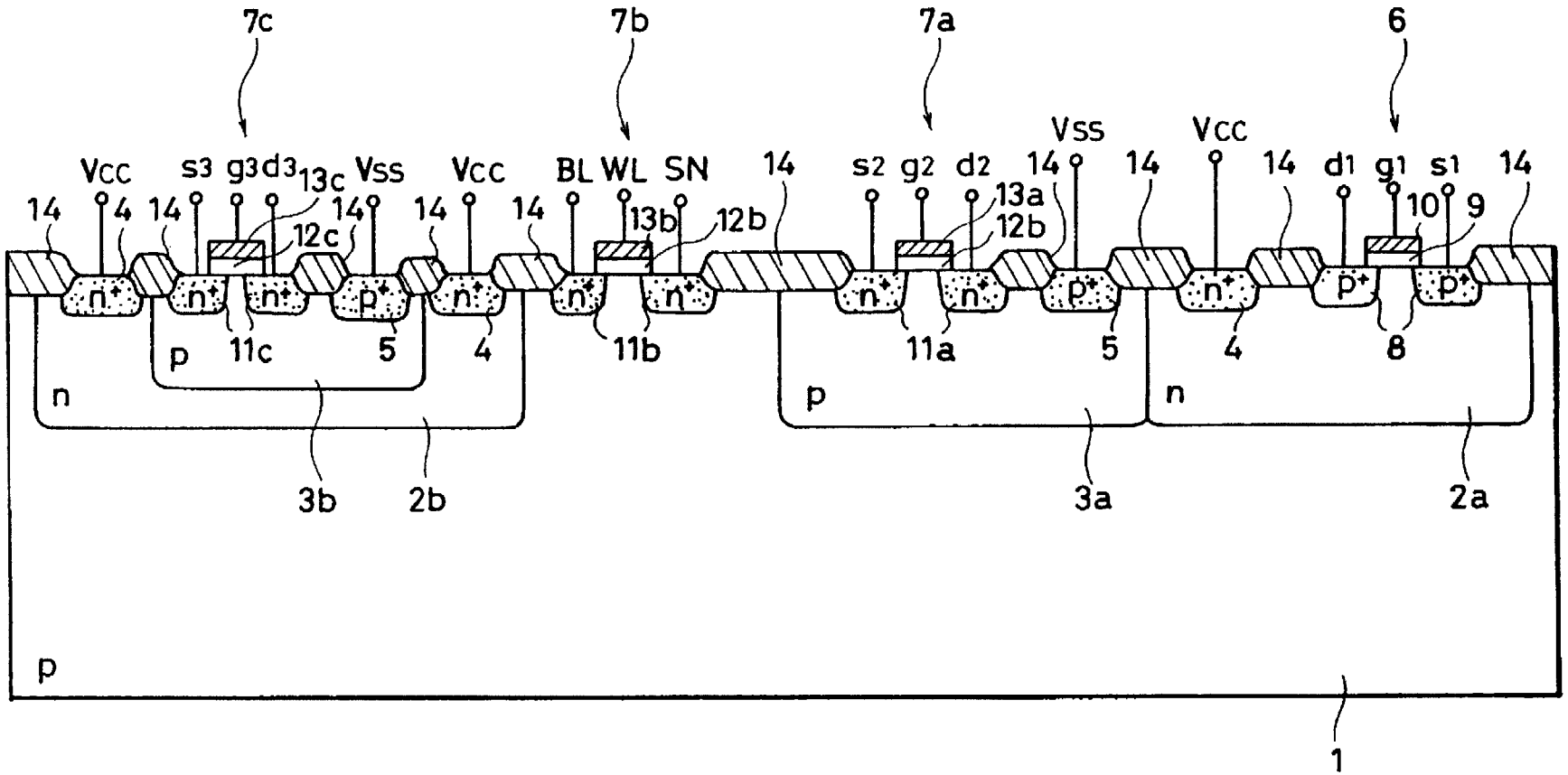
Figure 8:
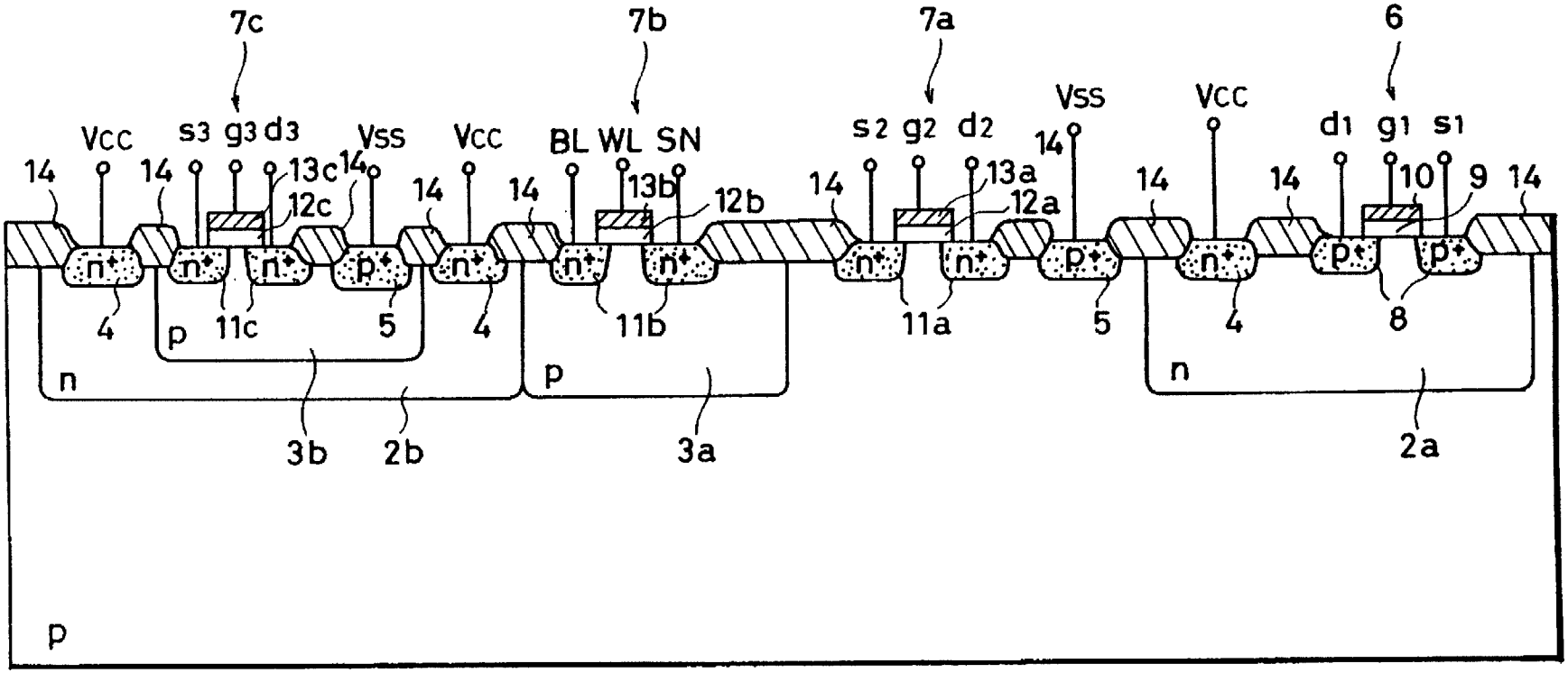
Figure 9:
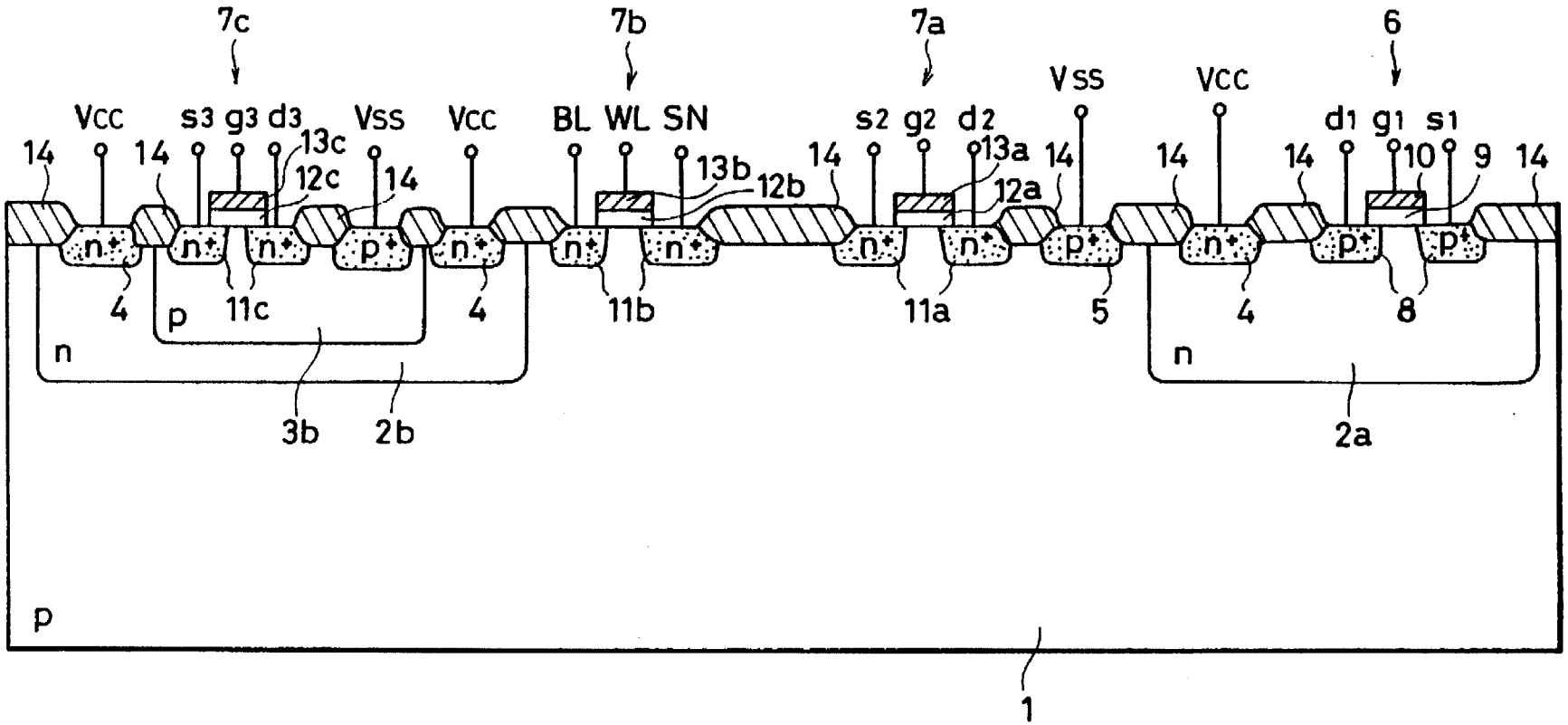
Figure 10:
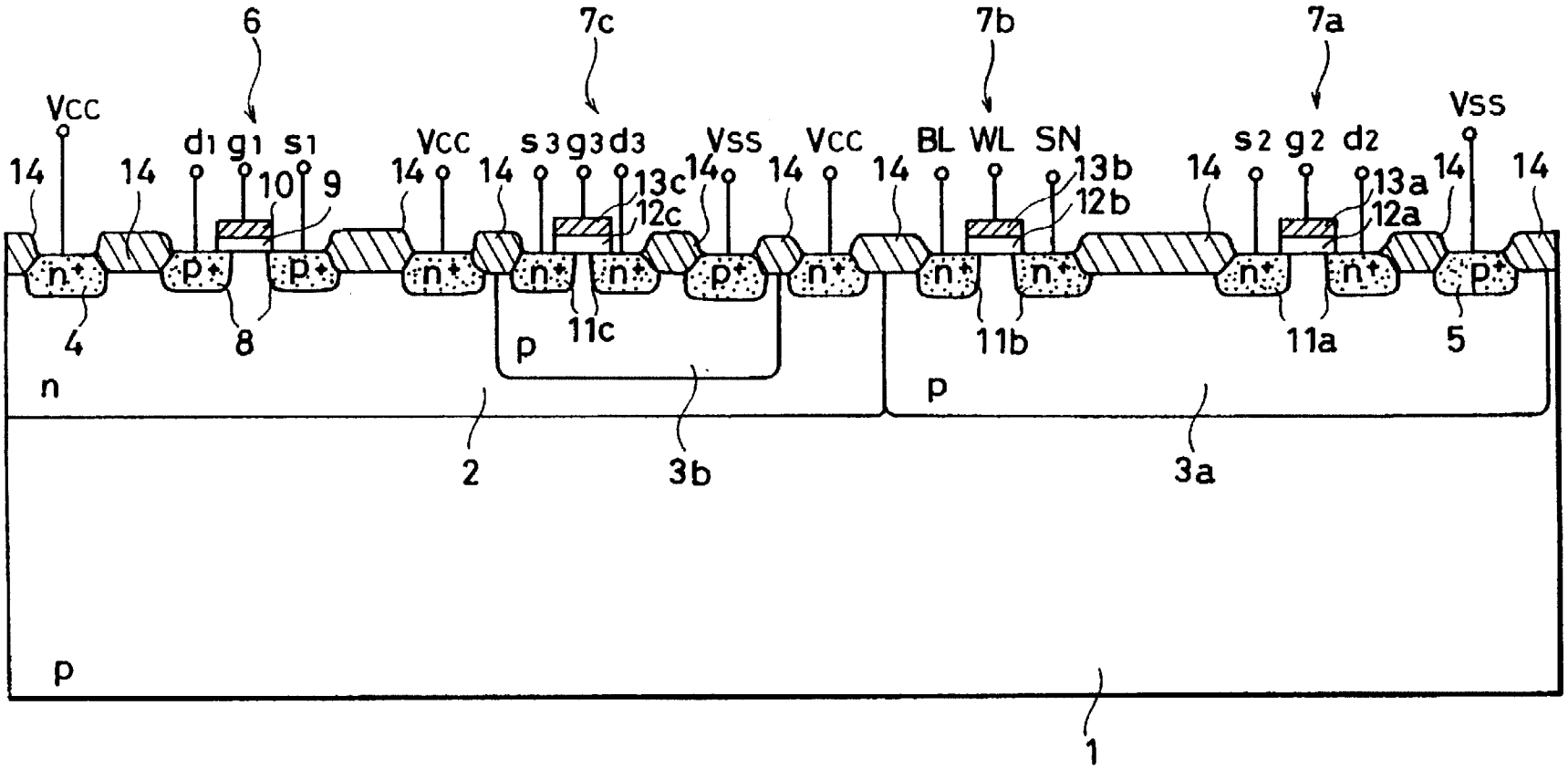
Figure 11:
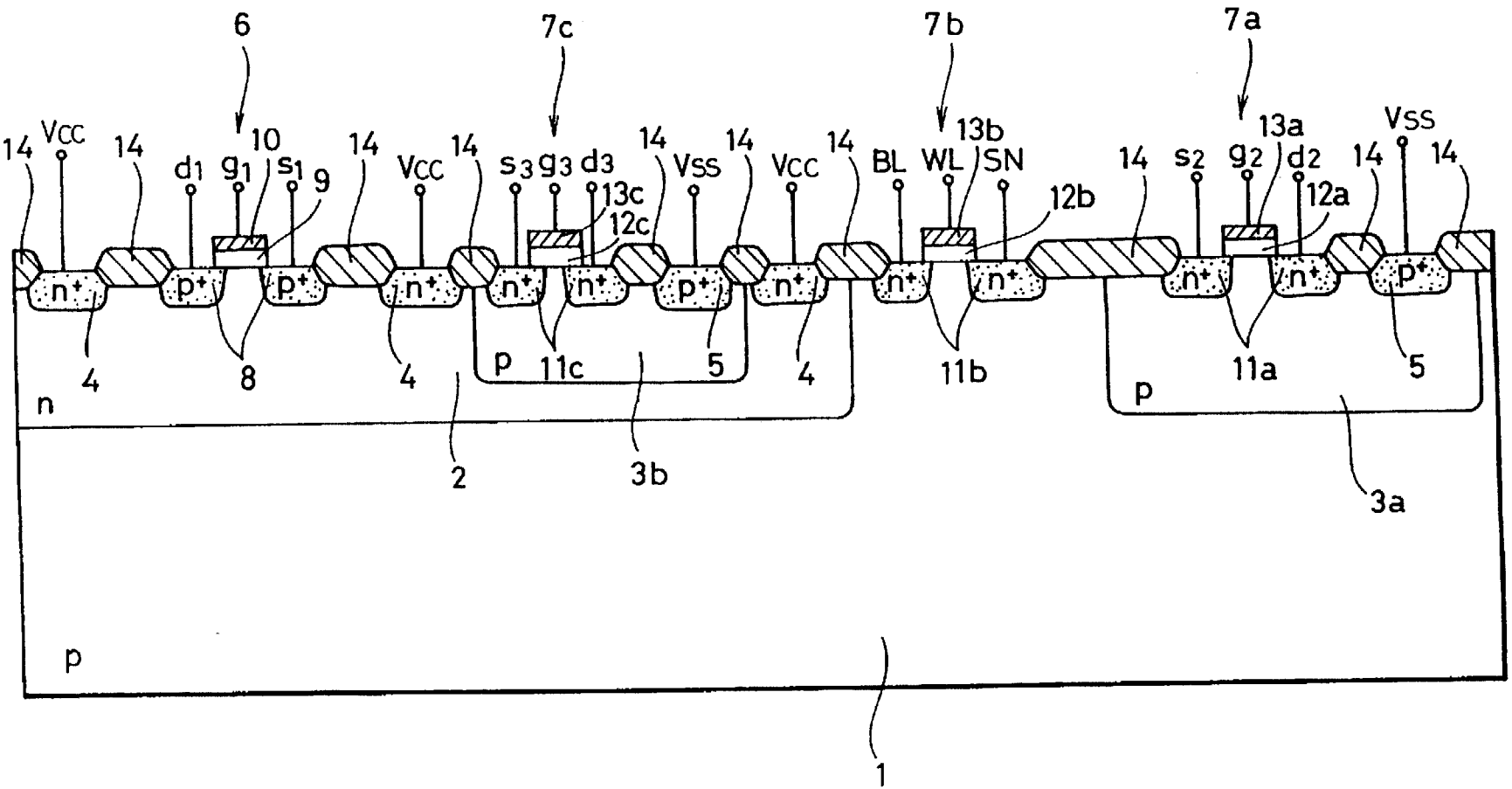
Figure 12:
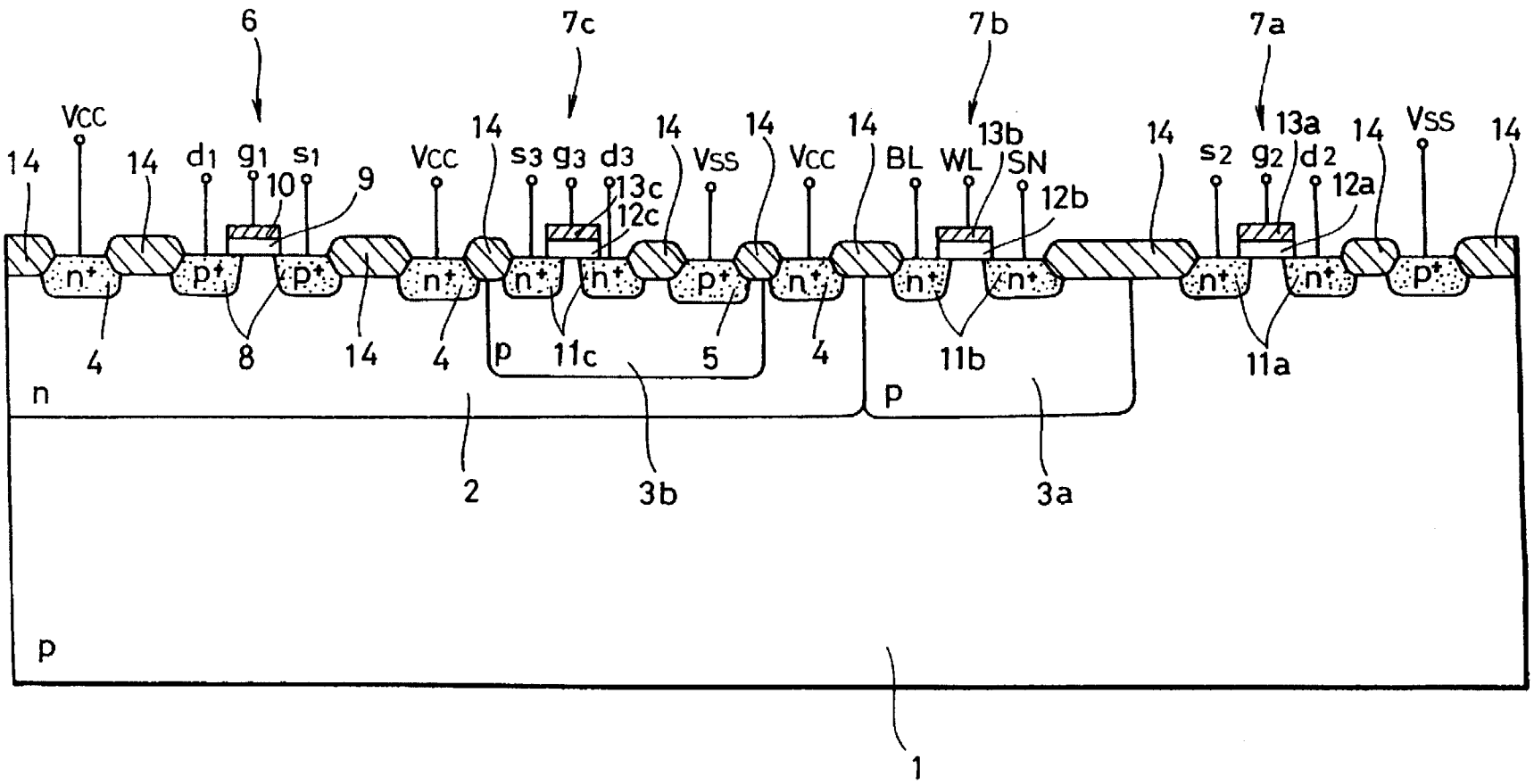
Figure 13:
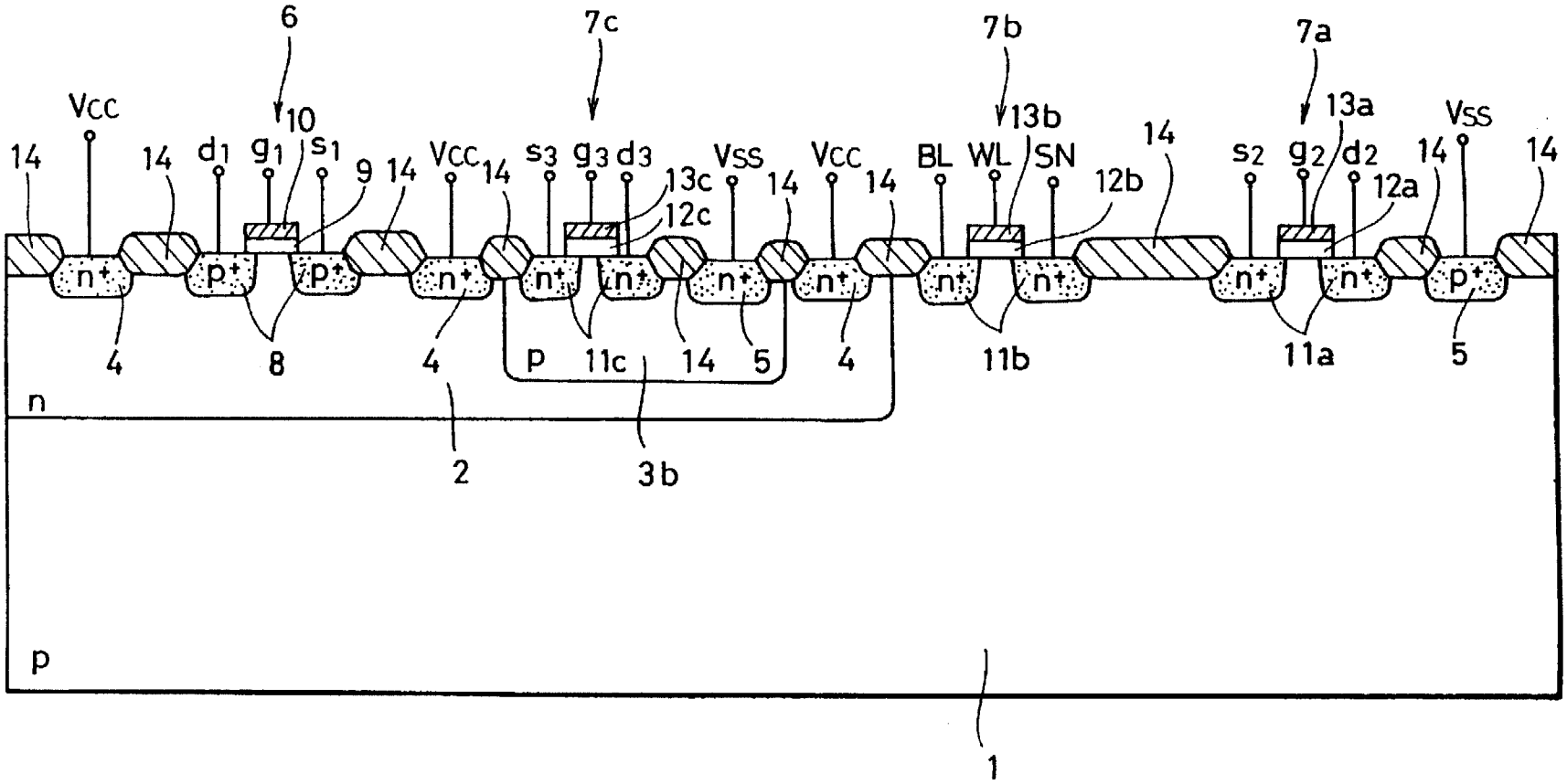

While the nMOSFETs 7a and 7b are both formed in the first p-well 3a in the structure above shown in FIG. 6, if either or both of the nMOSFETs 7a, and 7b are formed directly in a region where no well is formed on the p-type semiconductor substrate 1, for example, as shown in FIGS. 7, 8 and 9, the same effects as in the above-described structure of FIG. 6 can be achieved. In a structure shown in FIG. 7, the nMOSFET 7b (memory cell) is directly formed in a region of the substrate 1 where no well is formed and other portions are the same as those in FIG. 6. In a structure shown in FIG. 8, the nMOSFET 7a is directly formed in a region of the substrate 1 where no well is formed and other portions are the same as those in FIG. 6. In a structure shown in FIG. 9, the nMOSFETs 7a and 7b are both directly formed in a region of the substrate 1 where no well is formed and other portions are the same as those in FIG. 6.

While the first n-well region 2a and the second n-well region 2b are separate in the structures of FIGS. 6 to 9, the external input circuit may be formed on a second p-type well 3b formed inside the n-well 2 as shown in FIGS. 10 to 13 and the same effects can be achieved in these structures as in the structures shown in FIGS. 6 to 9. In the structures shown in FIGS. 10 to 13, while the second p-well 3b where the nMOSFET 7c is provided is formed inside the n-well 2, other portions are the same as those in the structures shown in FIGS. 6 to 9, respectively.

While both of the first p-well 3a and the second p-well 3b in the above described embodiments are fixed at the ground potential $V_{SS}$, the same effect can also be gained when the first p-well 3a and the second p-well 3b are each provided independently with a prescribed potential of polarity reverse to the power supply voltage or the potential of the ground level.

A third embodiment according to the present invention will now be described referring to FIGS. 14 and 15. A structure shown in FIG. 14 corresponds to that of the first embodiment shown in FIG. 4. In the structure, the second p-well 3b is not formed by implanting p-type impurities inside the n-well but is formed in a region of the semiconductor substrate 1 where no n-well is formed in the same manner as that of the first p-well 3a. The second p-well 3b is surrounded by the second n-well 2c and an n-type conductive layer 2d formed by implanting the n-type impurities by high energy ion implantation. Other elements are the same as those in the first embodiments shown in FIG. 4.

In this structure, similarly to the first embodiment above, the second P-type well 3b is electrically insulated from the first p-type well 3a and the semiconductor substrate 1, and even if an injection of electrons are injected into the first p-type region, the electrons are absorbed in the second n-well 2c and the n-type conductive layer 2d and are prevented from reaching the memory cell.

Figure 14:
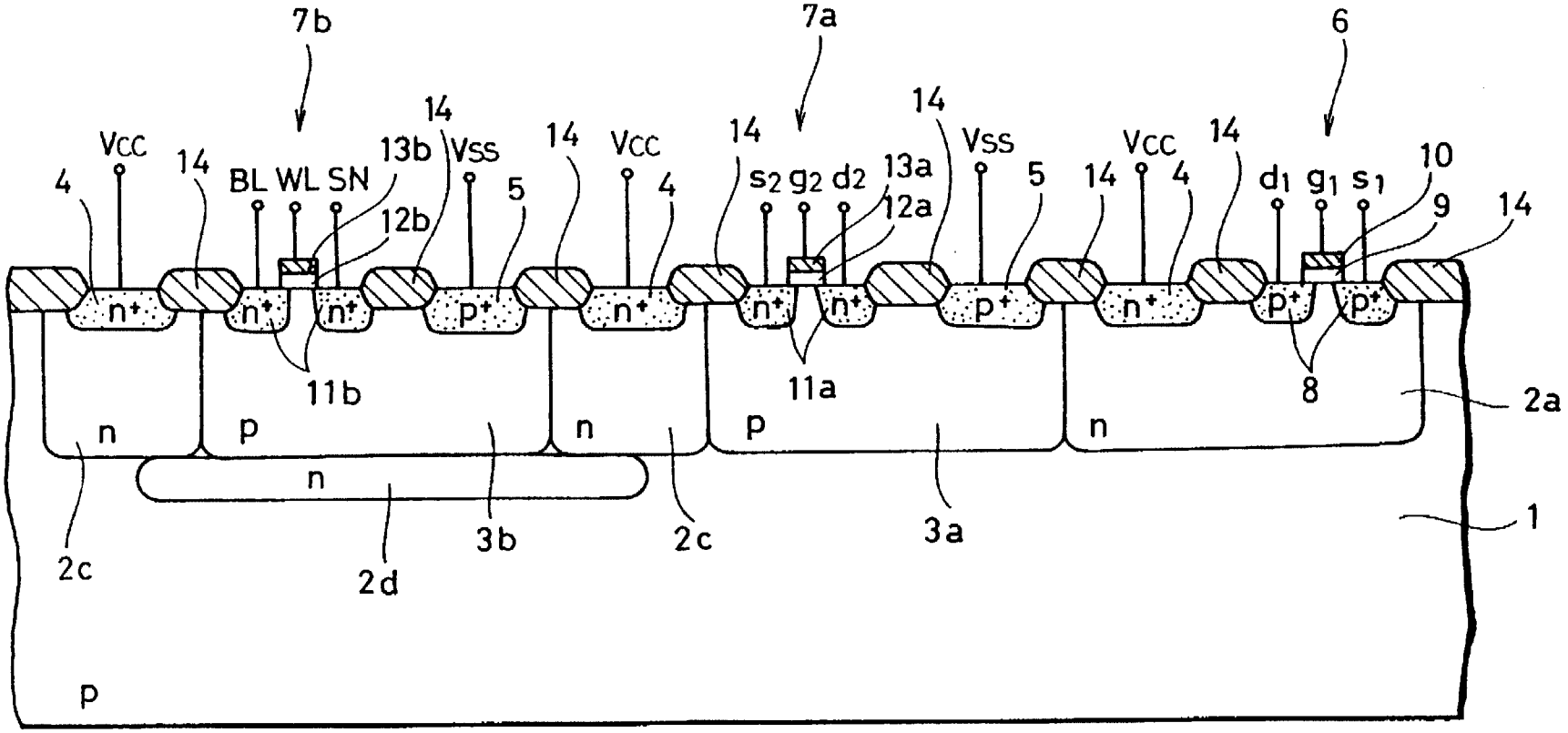
FIGS. 14 and 15 are cross sectional views showing a structure in accordance with a third embodiment of the present invention.

In the structure shown in FIG. 14, differently from the first and the second embodiments above, the first n-well and the second n-well 2c and the first p-well 3a and the second p-well 3b can be formed in the same process without changing the mount of impurities since the p-well is not formed in the n-well. Therefore, the amount of impurities in the second p-well does not become particularly large so that no reduction in the mobility of carriers is caused.

Figure 15:
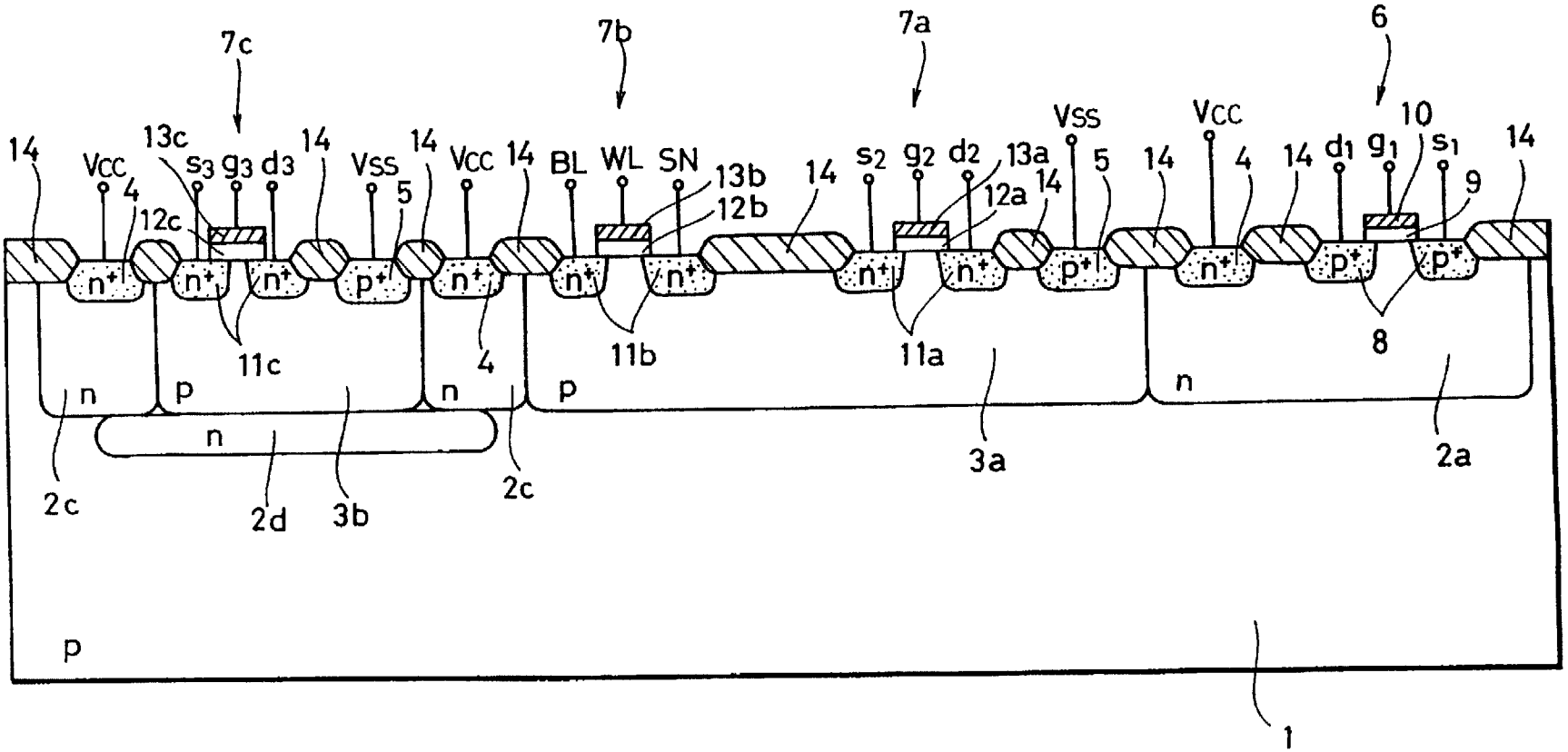

The structure shown in FIG. 15 shows a third embodiment according to the present invention corresponding the second embodiment shown in FIG. 6. Also, in this structure, the second p-well 3b is surrounded by the second n-well 2c and the n-type conductive layer 2d formed by implanting the n-type impurities by high energy ion implantation, so that the same effects can be achieved as in the elements shown in FIG. 14. Other structures are the same as those shown in FIG. 6.

The same effects can be achieved as in the manner shown in FIG. 15 by applying the structure according to this embodiment in which the second p-well has its side walls and bottom surface surrounded by the second n-well and the n-type conductive layer 2d in the manner as shown in FIGS. 7 to 13 according to the second embodiment.

While each of the embodiments above was described by referring to cases in which a p-well and an n-well are formed in a p-type semiconductor substrate, if an n-type semiconductor substrate is employed and the conductivity types of wells formed therein are all reversed, the carriers for which an injection becomes a problem are changed from electrons to holes and the same effects can be achieved as in each of the embodiments above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a first conductivity type semiconductor substrate having a surface;

a first well of a first conductivity type disposed in said semiconductor substrate at the surface;

a second well of a second conductivity type and a third well of the second conductivity type, said second and third wells being disposed in said semiconductor substrate at the surface [adjacent], *on opposite sides of, and contacting* said first well;

a fourth well of the first conductivity type disposed in said semiconductor substrate at the surface within and surrounded by said third well;

a memory cell disposed on the surface of said semiconductor substrate within said fourth well;

a first transistor disposed on the surface of said semiconductor substrate within said first well; and a second transistor disposed on the surface of said semiconductor substrate within said second well, said first and second transistors connected for writing data into said memory cell and reading data out of said memory cell, said second and third wells for connection to a power supply voltage, and said first well and said semiconductor substrate for connection to ground.

2. The [semiconductory] *semiconductor* memory device according to claim 1 including a first conductivity type impurity diffusion [regions] *region* isolated and insulated from other such regions, disposed at the surface of said semiconductor substrate in each of said first and fourth wells, respectively.

3. The semiconductor memory device according to claim 1 including a second conductivity type impurity diffusion region isolated and insulated from other such regions, disposed at the surface of said semiconductor substrate in said [fourth] *third* well, the second conductivity type impurity diffusion region for connection to the power supply.

4. The semiconductor memory device according to claim 1 including [a fifth well of the second conductivity type disposed at the surface in said substrate adjacent to said first well,] a MOSFET having a first conductivity type channel disposed in the [fourth] *second* well, a MOSFET having a second conductivity type channel disposed in said first well, said MOSFET having a first conductivity type channel and said MOSFET having a second conductivity type channel comprising a complementary MOS circuit.

5. The semiconductor memory device according to claim 1 wherein a prescribed voltage having a polarity opposite the power supply voltage is applied to said fourth well.

6. A semiconductor memory device comprising:

a first conductivity type semiconductor substrate having a surface;

a first well of the first conductivity type disposed in said semiconductor substrate at the surface;

a second well of a second conductivity type and a third well of the second conductivity type disposed in said semiconductor substrate at the surface adjacent said first well;

a fourth well of the first conductivity type disposed at the surface of said semiconductor substrate within and surrounded by said third well;

a memory cell disposed on the surface of said semiconductor substrate within said first well;

an external input circuit disposed on the surface of said semiconductor substrate within said fourth well;

a first transistor disposed on the surface of said semiconductor substrate within said first well; and a second transistor disposed on the surface of said semiconductor substrate within said second well wherein said first and second transistors are connected for writing data into said memory cell and reading data out of said memory cell, said second and third wells for connection to a power supply voltage, and said first well and said semiconductor substrate for connection to ground.

7. The semiconductor memory device according to claim 6 comprising a first conductivity type impurity diffusion region isolated and insulated from other such regions, disposed at the surface of said semiconductor substrate in said first well.

8. The semiconductor memory device according to claim 6 comprising a second conductivity type impurity diffusion region isolated and insulated from other such regions, disposed at the surface of said semiconductor substrate in said third well, the second conductivity type impurity diffusion region for connection to the power supply.

9. The semiconductor memory device according to claim 6 wherein a prescribed voltage having a polarity opposite the power supply voltage is applied to said fourth well.

10. A semiconductor memory device comprising:

a semiconductor substrate of a first conductivity type having a surface;

a first well of the first conductivity type, a second well of the first conductivity type, and a third well of [the] *a* second conductivity type, each of said first, second, and third wells extending from the surface of said semiconductor substrate into said semiconductor substrate to a predetermined depth, the first and third wells having *respective* lateral [interfaces] *boundaries* transverse to the surface that are contiguous with each other [and] *so that the third well surrounds the first well, the first and third wells also having respective* transverse [interfaces] *boundaries* generally parallel to the surface; and a second conductivity type conductive region disposed in said semiconductor substrate deeper than each of said first and third wells, contiguous to the transverse [interfaces] *boundaries* of said first and third wells, and formed by high energy ion implantation so that the first well is electrically insulated and isolated from said second well and from said semiconductor substrate.

11. The semiconductor memory device according to claim 10, said first well for connection to ground, including a memory cell disposed thereon at the surface of said semiconductor substrate, said third well for connection to the power supply voltage.

12. The semiconductor memory device according to claim 10 including an external input circuit disposed at the surface of said semiconductor substrate in the second well and a memory cell disposed at the surface of said semiconductor substrate in the first well, said first and second wells for connection to ground and said third well for connection to the power supply voltage.

*13. The semiconductor memory device according to claim 1 including second conductivity type impurity diffusion regions isolated and insulated from other such regions, disposed at the surface of said semiconductor substrate in said second well and third well, respectively, the second conductivity type impurity diffusion regions for connection to the power supply.*

*14. The semiconductor memory device according to claim 1 including a first conductivity type impurity diffusion region isolated and insulated from other such regions, disposed at the surface of said semiconductor substrate in said first well.*

*15. The semiconductor memory device according to claim 6 comprising first conductivity type impurity diffusion regions isolated and insulated from other such regions, disposed at the surface of said semiconductor substrate in said first and fourth wells, respectively.*

*16. The semiconductor memory device according to claim 6 comprising second conductivity type impurity diffusion regions isolated and insulated from other such regions, disposed at the surface of said semiconductor substrate in said second and third wells, respectively, the second conductivity type impurity diffusion regions for connection to the power supply.*

* * * * *